United States Patent
Shigematsu

(10) Patent No.: US 8,004,658 B2
(45) Date of Patent: Aug. 23, 2011

(54) LIGHTING OPTICAL DEVICE, EXPOSURE SYSTEM, AND EXPOSURE METHOD

(75) Inventor: Koji Shigematsu, Kawasaki (JP)

(73) Assignee: Nikon Corporation, Tokyo (JP)

( * ) Notice: Subject to any disclaimer, the term of this patent is extended or adjusted under 35 U.S.C. 154(b) by 1051 days.

(21) Appl. No.: 11/665,669

(22) PCT Filed: Oct. 12, 2005

(86) PCT No.: PCT/JP2005/018809
§ 371 (c)(1), (2), (4) Date: Jun. 21, 2007

(87) PCT Pub. No.: WO2006/043458
PCT Pub. Date: Apr. 27, 2006

(65) Prior Publication Data
US 2008/0030852 A1    Feb. 7, 2008

(30) Foreign Application Priority Data

Oct. 19, 2004    (JP) ................. 2004-303902

(51) Int. Cl.
G03B 27/72    (2006.01)
G03B 27/54    (2006.01)

(52) U.S. Cl. .......................... 355/71; 355/67
(58) Field of Classification Search .............. 355/67, 355/71
See application file for complete search history.

(56) References Cited

U.S. PATENT DOCUMENTS

| | | | |
|---|---|---|---|
| 5,329,333 A | 7/1994 | Noguchi et al. | |
| 5,526,094 A | 6/1996 | Noguchi et al. | |
| 5,767,949 A | 6/1998 | Noguchi et al. | |
| 6,016,187 A | 1/2000 | Noguchi et al. | |
| 6,285,443 B1 | 9/2001 | Wangler et al. | |
| 6,335,146 B1 | 1/2002 | Noguchi et al. | |
| 6,485,891 B1 | 11/2002 | Noguchi et al. | |
| 6,563,567 B1 | 5/2003 | Komatsuda et al. | |

(Continued)

FOREIGN PATENT DOCUMENTS

DE    43 01 574 A1    7/1994

(Continued)

OTHER PUBLICATIONS

May 9, 2011 Office Action issued in European Patent Application No. 05793150.3.

*Primary Examiner* — Peter B Kim
(74) *Attorney, Agent, or Firm* — Oliff & Berridge, PLC

(57) ABSTRACT

An illumination optical apparatus is able to accomplish desired annular illumination, circular illumination, and so on, without substantial influence of the zero-order light from a diffractive optical element. The illumination optical apparatus comprises a diffractive optical element (3) which converts a light beam from a light source (1) into a light beam with a predetermined light intensity distribution; an optical integrator (8) disposed between the diffractive optical element and a surface to be illuminated (M) and adapted for forming a substantial surface illuminant on an illumination pupil plane on the basis of the light beam from the diffractive optical element; a shaping optical system (4, 6, 7) disposed between the diffractive optical element and the optical integrator and adapted for changing a size and shape of the substantial surface illuminant; and a preventing device disposed at a position substantially in the relation of Fourier transform with the diffractive optical element in an optical path of the shaping optical system, and adapted for preventing the zero-order light from the diffractive optical element from traveling along an illumination light path.

48 Claims, 12 Drawing Sheets

U.S. PATENT DOCUMENTS

| | | |
|---|---|---|
| 6,741,394 B1 | 5/2004 | Tanitsu et al. |
| 2001/0043318 A1 | 11/2001 | Mori |
| 2003/0073045 A1 | 4/2003 | Noguchi et al. |
| 2003/0156266 A1 | 8/2003 | Tanitsu |
| 2003/0156269 A1 | 8/2003 | Komatsuda et al. |
| 2003/0160949 A1 | 8/2003 | Komatsuda et al. |
| 2004/0125459 A1 | 7/2004 | Tanitsu et al. |
| 2006/0039072 A1 | 2/2006 | Ruoff et al. |

FOREIGN PATENT DOCUMENTS

| | | |
|---|---|---|
| EP | 0 967 524 A2 | 12/1999 |
| EP | 1 434 092 A1 | 6/2004 |
| JP | A 05-160002 | 6/1993 |
| JP | A 06-124873 | 5/1994 |
| JP | A 08-203801 | 8/1996 |
| JP | A 10-303114 | 11/1998 |
| JP | A 2001-176766 | 6/2001 |
| JP | A 2001-284240 | 10/2001 |
| JP | A 2001-338861 | 12/2001 |
| JP | A 2002-158157 | 5/2002 |
| JP | A 2005-243904 | 9/2005 |
| WO | WO 99/49504 A1 | 9/1999 |
| WO | WO 2005071474 A2 * | 8/2005 |
| WO | WO 2006/021540 A2 | 3/2006 |

* cited by examiner (a)                    (b)

Fig.5
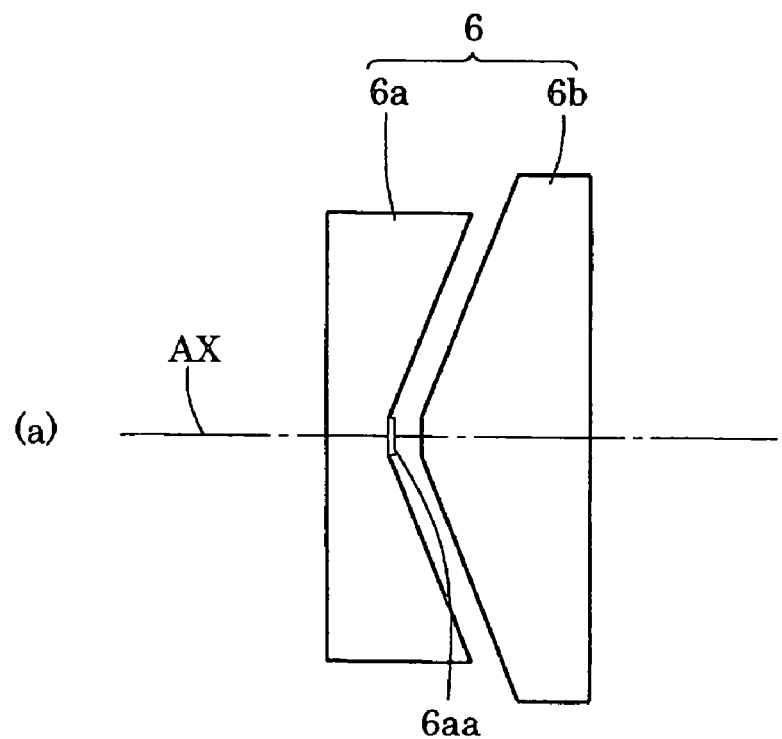
(a)
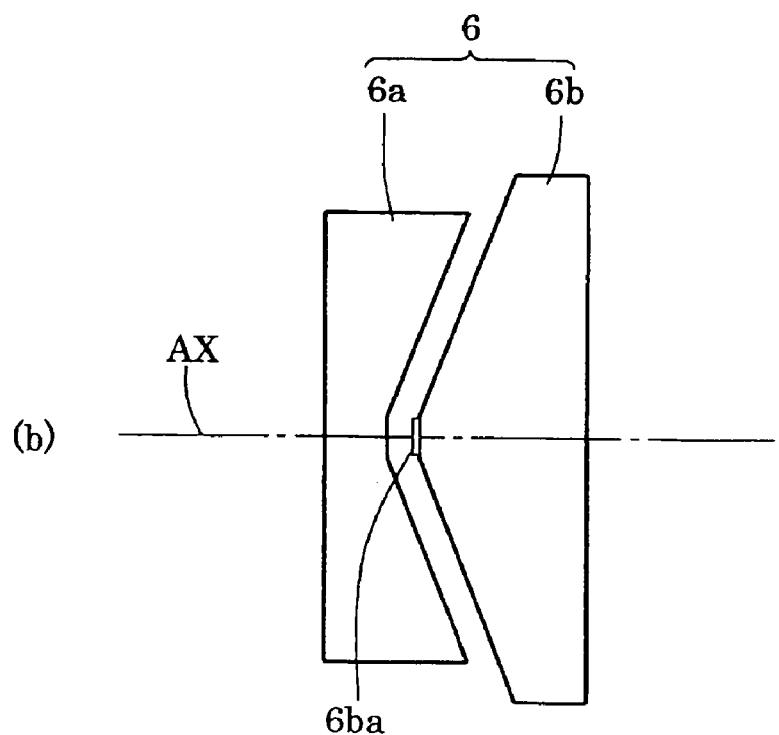
(b)

Fig.7
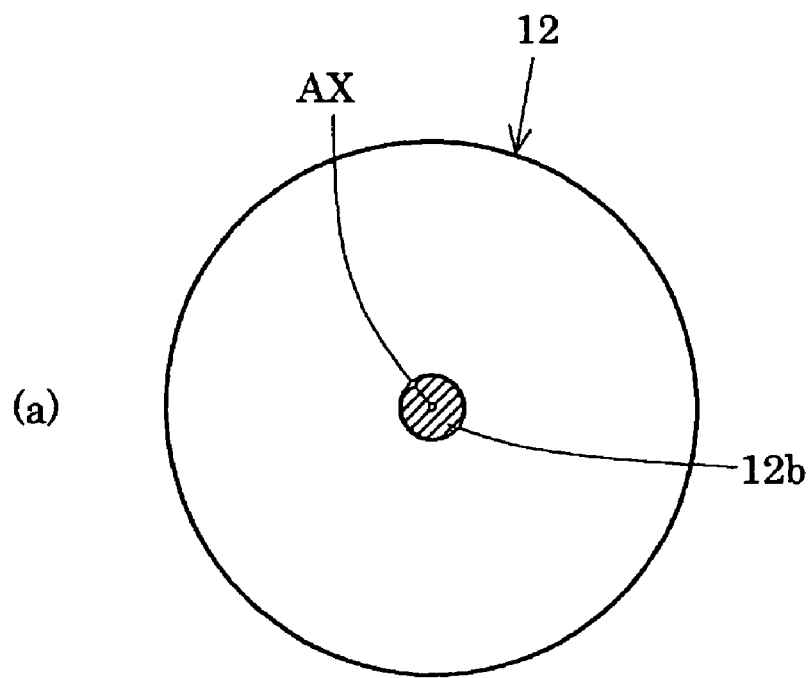
(a)
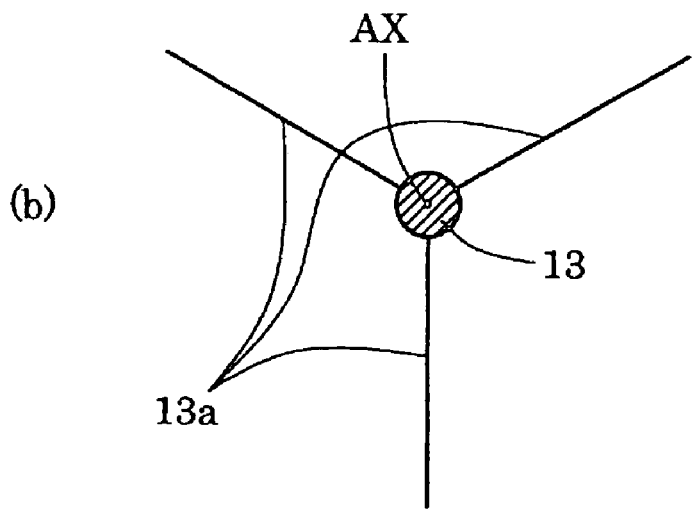
(b)

LIGHTING OPTICAL DEVICE, EXPOSURE SYSTEM, AND EXPOSURE METHOD

CROSS-REFERENCE TO RELATED APPLICATIONS

This application is based upon and claims the benefit of priorities from International Application No. PCT/JP2005/018809 filed on Oct. 12, 2005, and Japanese Patent Application No. 2004-110342 filed on Oct. 19, 2004, the entire contents of which are incorporated herein by reference.

BACKGROUND

1. Field

One embodiment of the present invention relates to an illumination optical apparatus, exposure apparatus, and exposure method and, more particularly, to an illumination optical apparatus suitably applicable to exposure apparatus for manufacturing micro devices, such as semiconductor devices, image pickup devices, liquid-crystal display devices, and thin-film magnetic heads, for example, by lithography.

2. Description of the Related Art

In the typical exposure apparatus of this type, a light beam emitted from a light source is guided through a fly's eye lens as an optical integrator to form a secondary light source as a substantial surface illuminant consisting of a lot of light sources. Light beams from the secondary light source are guided through an aperture stop disposed in the vicinity of the rear focal plane of the fly's eye lens, to be limited thereby, and then enter a condenser lens.

The light beams condensed by the condenser lens illuminate a mask with a predetermined pattern therein, in a superposed manner. Light transmitted by the pattern of the mask travels through a projection optical system to be focused on a wafer. In this manner the mask pattern is projected (or transferred) onto the wafer to effect exposure thereof. The pattern formed in the mask is of high integration and a uniform illuminance distribution must be formed on the wafer in order to accurately transfer the microscopic pattern onto the wafer.

For highly accurately transferring the microscopic pattern onto the wafer, attention is being focused on the technology of forming the secondary light source of circular shape on the rear focal plane of the fly's eye lens and changing the size thereof to vary the coherency $\sigma$ of illumination ($\sigma$ value=diameter of an aperture stop/pupil diameter of a projection optical system, or $\sigma$ value=exit-side numerical aperture of an illumination optical system/entrance-side numerical aperture of the projection optical system). Furthermore, attention is also focused on the technology of forming the secondary light source of annular shape or quadrupole shape on the rear focal plane of the fly's eye lens to improve the depth of focus and resolving power of the projection optical system.

The conventional exposure apparatus as described above were arranged to convert an incident light beam into a light beam of a desired sectional shape by a diffractive optical element and to guide it to the entrance surface of the fly's eye lens to accomplish normal circular illumination based on the circular secondary light source, or to accomplish modified or off-axis illumination (annular illumination or quadrupole illumination) based on the secondary light source of an annular shape or quadrupole shape. The diffractive optical element herein is so designed substantially as not to generate the zero-order light (direct light).

It is, however, difficult to avoid occurrence of zero-order light from the diffractive optical element, for example, because of manufacture error or the like. In this case, the zero-order light arising from the diffractive optical element becomes unwanted light as focused in the central area (portion in the vicinity of the optical axis) on the entrance surface of the fly's eye lens and, for example, during annular illumination, it forms a surface illuminant in a relatively small size but with a high luminance in the center of the annular secondary light source. As a result, the unwanted surface illuminant is formed in the center of the annular secondary light source, which results in failure in accomplishment of desired annular illumination.

The conventional technology proposes a configuration for blocking light near the optical axis (or the zero-order light from the diffractive optical element) in the vicinity of the entrance surface or the exit surface of the fly's eye lens, in order to accomplish the desired annular illumination.

As described above, the conventional technology adopts the center blocking in the vicinity of the entrance surface or the exit surface of the fly's eye lens to avoid the influence of the zero-order light from the diffractive optical element, thereby achieving the desired annular illumination. In the circular illumination, however, a relatively small dark part is formed in the center of the secondary light source because of influence of the foregoing center blocking and thus the secondary light source of annular shape is formed instead of the desired circular secondary light source.

In the case of circular illumination using a relatively large, circular, secondary light source, i.e., in the case of large-$\sigma$ circular illumination, the outside diameter of the secondary light source is much larger than that of the dark part, so that almost desired large-$\sigma$ circular illumination can be accomplished with little influence of the dark part. In the case of small-$\sigma$ circular illumination using a relatively small, circular, secondary light source, however, an annular secondary light source substantially different from the desired circular shape is formed because of influence of the dark part, thus failing to accomplish the desired small-$\sigma$ circular illumination.

An object of the present invention is to provide an illumination optical apparatus capable of accomplishment desired annular illumination, circular illumination, and so on, without substantial influence of the zero-order light from a diffractive optical element. Another object of the invention is to provide an exposure apparatus and exposure method capable of performing good exposure under an appropriate illumination condition realized according to a pattern characteristic of a mask, using an illumination optical apparatus achieving desired annular illumination, circular illumination, and so on without substantial influence of the zero-order light from a diffractive optical element.

SUMMARY

A first embodiment of the present invention provides an illumination optical apparatus that illuminates a surface to be illuminated, with a light beam from a light source, the illumination optical apparatus comprising:

a diffractive optical element disposed in an optical path between the light source and the surface to be illuminated;

an optical integrator disposed in an optical path between the diffractive optical element and the surface to be illuminated; and a beam damper disposed at a position in the optical path between the diffractive optical element and the optical integrator, where zero-order light from the diffractive optical element is focused, wherein all optical elements disposed in an optical path between the diffractive optical element and the beam damper, and wherein an optical system disposed in an optical path between the beam damper and the optical integrator includes movable optical element.

A second embodiment of the present invention provides an illumination optical apparatus that illuminates a surface to be illuminated, with a light beam from a light source, the illumination optical apparatus comprising:

a diffractive optical element disposed in an optical path between the light source and the surface to be illuminated;

an optical integrator disposed in an optical path between the diffractive optical element and the surface to be illuminated;

a first beam damper which is disposed at a position in the optical path between the diffractive optical element and the optical integrator, where zero-order light from the diffractive optical element is focused, and which includes a first damp area; and a second beam damper which is interchangeable with the first beam damper, and which includes a second damp area which differs from the first damp area in size.

A third embodiment of the present invention provides an illumination optical apparatus that illuminates a surface to be illuminated, with a light beam from a light source, the illumination optical apparatus comprising:

a diffractive optical element, arranged in an optical path between the light source and the surface to be illuminated, which converts the light beam from the light source into a light beam with a predetermined light intensity distribution;

an optical integrator disposed in an optical path between the diffractive optical element and the surface to be illuminated;

a shaping optical system disposed in an optical path between the diffractive optical element and the optical integrator and adapted for changing a size and shape of a substantial surface illuminant; and preventing device disposed at a position in the optical path between the diffractive optical element and the optical integrator, where zero-order light from the diffractive optical element is focused, and adapted for preventing the zero-order light from the diffractive optical element from traveling along an illumination light path;

wherein the preventing device restrains influence thereof on the substantial surface illuminant even when the shaping optical system changes the size of the substantial surface illuminant.

A fourth embodiment of the present invention provides an illumination optical apparatus that illuminates a surface to be illuminated, with a light beam from a light source, the illumination optical apparatus comprising:

a diffractive optical element, arranged in an optical path between the light source and the surface to be illuminated, which converts the light beam from the light source into a light beam with a predetermined light intensity distribution;

an optical integrator disposed in an optical path between the diffractive optical element and the surface to be illuminated;

a shaping optical system disposed in an optical path between the diffractive optical element and the optical integrator and adapted for changing a size and shape of the substantial surface illuminant; and preventing device disposed at a position where zero-order light from the diffractive optical element is focused, in an optical path of the shaping optical system, and adapted for preventing the zero-order light from the diffractive optical element from traveling along an illumination light path.

A fifth embodiment of the present invention provides an exposure apparatus comprising the illumination optical apparatus of the first through fourth embodiment for illuminating a pattern, and being adapted for exposure of the pattern on a photosensitive substrate.

A fourth embodiment of the present invention provides an exposure method comprising illuminating a pattern by using the illumination optical apparatus of the first through fourth embodiment; and exposing a pattern on a photosensitive substrate.

A fifth embodiment of the present invention provides a device manufacturing method comprising: illuminating a pattern by using the illumination optical apparatus of the first through fourth embodiment; exposing the pattern on a photosensitive substrate; and a development step of developing the photosensitive substrate.

BRIEF DESCRIPTION OF THE DRAWINGS

FIG. 5 is a drawing schematically showing a configuration of a preventing device being a characteristic configuration of the embodiment.

FIG. 7 is a drawing schematically showing a modification example of the preventing device.

DESCRIPTION OF THE EMBODIMENTS

Figure 1:
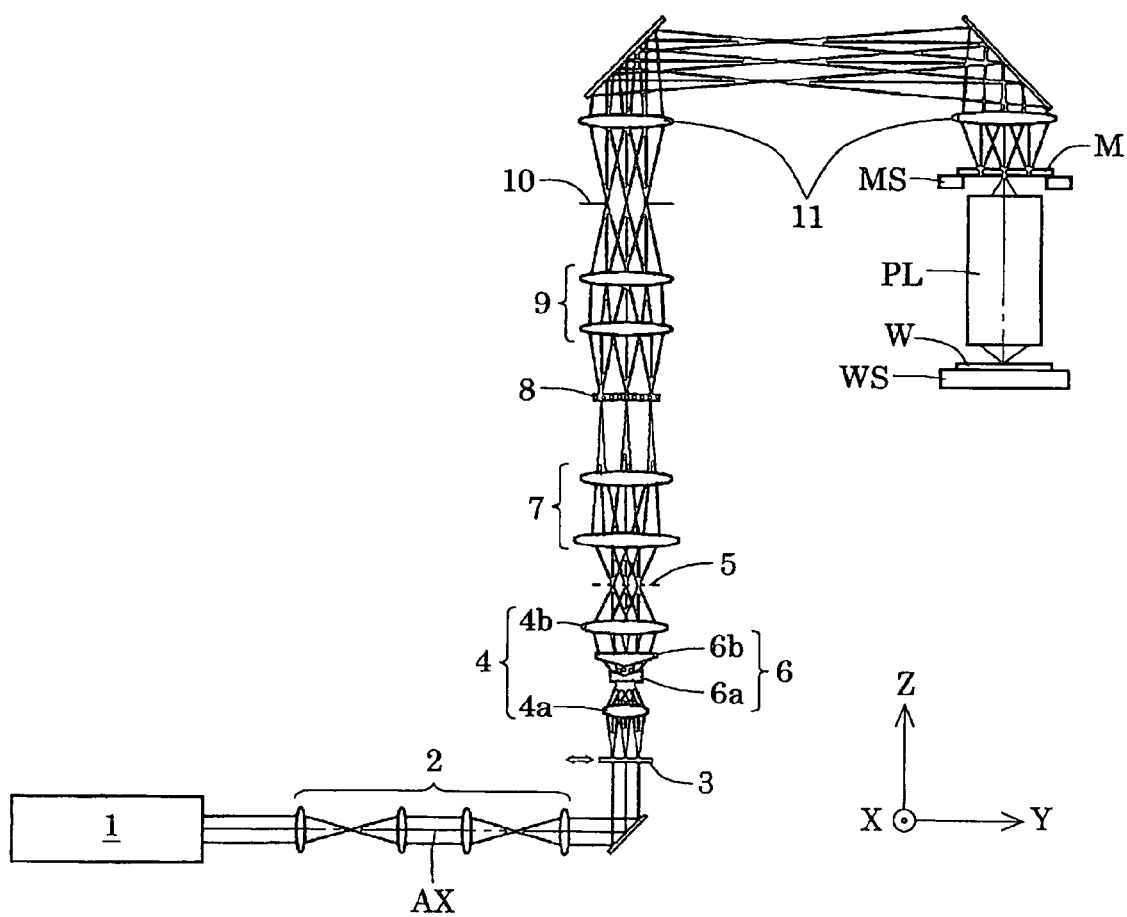
FIG. 1 is a drawing schematically showing a configuration of an exposure apparatus according to an embodiment of the present invention.

Embodiments of the present invention will be described on the basis of the accompanying drawings. FIG. 1 is a drawing schematically showing a configuration of an exposure apparatus according to an embodiment of the present invention. In FIG. 1, the Z-axis is set along a direction of a normal to a wafer W being a photosensitive substrate, the Y-axis along a direction parallel to the page of FIG. 1 in the surface of wafer W, and the X-axis along a direction perpendicular to the page of FIG. 1 in the surface of wafer W.

With reference to FIG. 1, the exposure apparatus of the present embodiment is provided with a light source 1 for supplying exposure light (illumination light). The light source 1 to be used can be, for example, an ArF excimer laser light source for supplying light of the wavelength of 193 nm. A nearly parallel light beam emitted from the light source 1 travels via a relay lens system 2 and a diffractive optical element 3 for annular illumination to enter an afocal lens 4. The relay lens system 2 has a function of converting the nearly parallel light beam from the light source 1 into a nearly parallel light beam having a cross section of a predetermined rectangular shape and guiding it to the diffractive optical element 3.

The afocal lens 4 is an afocal system (afocal optic) so set that the front focal position thereof is approximately coincident with the position of the diffractive optical element 3 and that the rear focal position thereof is approximately coincident with a position of a predetermined plane 5 indicated by a dashed line in the drawing. On the other hand, the diffractive optical element 3 is made by forming steps with a pitch approximately equal to the wavelength of the exposure light (illumination light) in a substrate, and functions to diffract an incident light beam at desired angles. Specifically, the diffractive optical element 3 for annular illumination has the following function: when a parallel light beam with a rectangular cross section is incident to the diffractive optical element 3, it forms a light intensity distribution of an annular shape in its far field (or Fraunhofer diffraction region).

Therefore, the nearly parallel light beam incident to the diffractive optical element 3 as a light beam conversion element forms an annular light intensity distribution on the pupil plane of the afocal lens 4 as a relay optical system and thereafter is exited as a nearly parallel light beam from the afocal lens 4. A conical axicon system 6 is disposed in the optical path between a front lens unit 4a and a rear lens unit 4b of the afocal lens 4 and at or near the pupil plane thereof, and the detailed configuration and operation thereof will be described later. For simplification of description, the basic configuration and operation will be described below, while ignoring the operation of the conical axicon system 6.

The light beam having passed through the afocal lens 4 travels through a zoom lens 7 for variation of σ-value to enter a micro fly's eye lens (or fly's eye lens) 8 as an optical integrator. The micro fly's eye lens 8 is an optical element consisting of a number of micro-lenses with a positive refractive power arranged vertically and horizontally, and densely. In general, a micro fly's eye lens is made, for example, by forming a micro-lens group in a plane-parallel plate by etching.

Each of the micro-lenses constituting the micro fly's eye lens is smaller than each of lens elements constituting a fly's eye lens. The micro fly's eye lens is a lens wherein a number of micro-lenses (micro-refracting surfaces) are integrally formed without being isolated from each other, different from the fly's eye lens consisting of lens elements isolated from each other. However, the micro fly's eye lens is an optical integrator of the same wavefront splitting type as the fly's eye lens in that the lens elements with a positive refractive power are arranged vertically and horizontally.

The predetermined plane 5 is located near the front focal position of the zoom lens 7 and the entrance surface of the micro fly's eye lens 8 is located near the rear focal position of the zoom lens 7. In other words, the zoom lens 7 functions to arrange the predetermined plane 5 and the entrance surface of the micro fly's eye lens 8 substantially in the relation of Fourier transform and, eventually, to arrange the pupil plane of the afocal lens 4 and the entrance surface of the micro fly's eye lens 8 substantially optically conjugate with each other.

Therefore, for example, an annular illumination field centered on the optical axis AX is formed on the entrance surface of the micro fly's eye lens 8, as on the pupil plane of the afocal lens 4. The overall shape of this annular illumination field varies similarly depending upon the focal length of the zoom lens 7 as described below. Each micro-lens forming the micro fly's eye lens 8 has a rectangular cross section similar to a shape of an illumination field to be formed on a mask M (and, eventually, similar to a shape of an exposure region to be formed on a wafer W).

The light beam incident to the micro fly's eye lens 8 is two-dimensionally split by the multiple micro-lenses to form a secondary light source having much the same light intensity distribution as the illumination field formed by the incident light beam, i.e., a secondary light source having a substantial surface illuminant of an annular shape centered on the optical axis AX, on or near the rear focal plane of the micro fly's eye lens 8 (and on the illumination pupil plane eventually). Light beams from the secondary light source formed on or near the rear focal plane of the micro fly's eye lens 8 travel through a condenser optical system 9 and then illuminate a mask blind 10 in a superposed manner.

In this manner, a rectangular illumination field according to the shape and focal length of each micros-lens forming the micro fly's eye lens 8 is formed on the mask blind 10 as an illumination field stop. The light beam having passed through a rectangular aperture (light transmitting portion) of the mask blind 10 is subject to focusing operation of an imaging optical system 11 and then illuminates the mask M with the predetermined pattern therein, in a superposed manner. Namely, the imaging optical system 11 forms an image of the rectangular aperture of the mask blind 10 on the mask M.

The light beam transmitted by the pattern of the mask M held on a mask stage MS travels through a projection optical system PL to form an image of the mask pattern on the wafer W (a photosensitive substrate) held on a wafer stage WS. While the wafer stage WS is two-dimensionally driven and controlled in the plane (XY plane) perpendicular to the optical axis AX of the projection optical system PL, i.e., while the wafer W is two-dimensionally driven and controlled, one-shot exposure or scan exposure is effected to sequentially project the pattern of the mask M into each of exposure regions on the wafer W.

Figure 2:
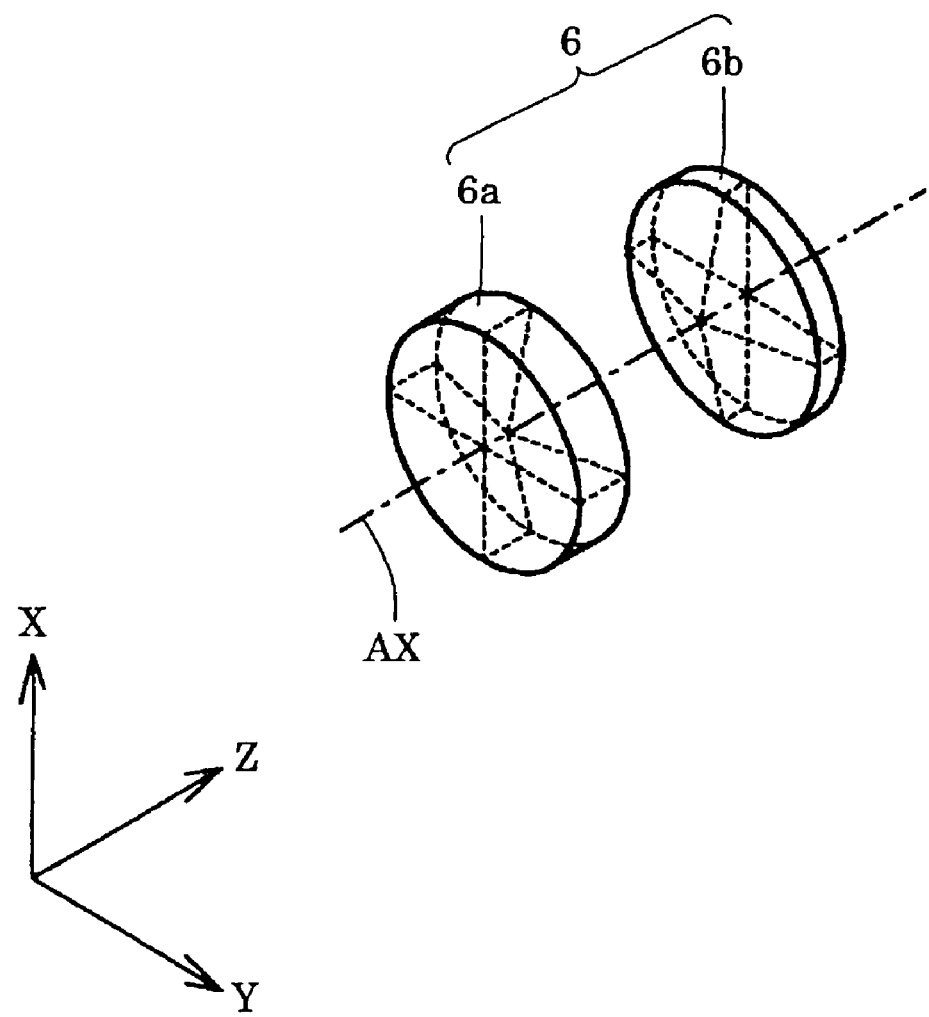
FIG. 2 is a drawing schematically showing a configuration of a conical axicon system in FIG. 1.

FIG. 2 is a drawing schematically showing the configuration of the conical axicon system disposed in the optical path between the front lens unit and the rear lens unit of the afocal lens. The conical axicon system 6 is composed of a first prism member 6a a planar surface of which faces the light source side and a refracting surface of a concave conical shape of which faces the mask side, and a second prism member 6b a planar surface of which faces the mask side and a refracting surface of a convex conical shape of which faces the light source side, in order from the light source side.

Then the refracting surface of the concave conical shape of the first prism member 6a and the refracting surface of the convex conical shape of the second prism member 6b are formed in such complementary shapes as to be able to butt each other. At least one of the first prism member 6a and the second prism member 6b is arranged to be movable along the optical axis AX to vary the distance between the refracting surface of the concave conical shape of the first prism member 6a and the refracting surface of the convex conical shape of the second prism member 6b.

In a state in which the refracting surface of the concave conical shape of the first prism member 6a butts on the refracting surface of the convex conical shape of the second prism member 6b, the conical axicon system 6 functions as a plane-parallel plate and has no effect on the secondary light source of annular shape formed. However, when the refracting surface of the concave conical shape of the first prism member 6a is located apart from the refracting surface of the convex conical shape of the second prism member 6b, the conical axicon system 6 functions a so-called light beam expander. Therefore, an angle of the incident light beam to the predetermined plane 5 varies with change in the distance in the conical axicon system 6.

Figure 3:
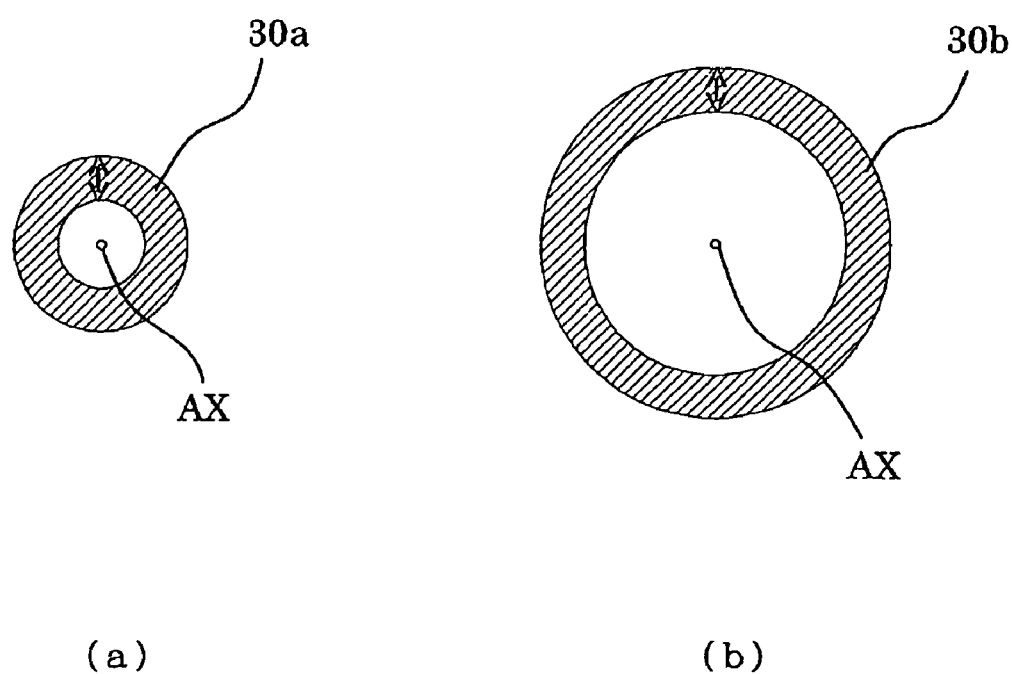
FIG. 3 is a drawing for explaining the operation of the conical axicon system on a secondary light source of an annular shape.

FIGS. 3 (a) and (b) is a drawing for explaining the operation of the conical axicon system on the secondary light source of annular shape. With reference to FIG. 3 (a), the smallest secondary light source 30a of annular shape is formed in a state in which the distance in the conical axicon system 6 is zero and in which the focal length of the zoom lens 7 is set at a minimum (which will be referred to hereinafter as "standard state"), and when the distance in the conical axicon system 6 is increased from zero to a predetermined value, the secondary light source 30a is changed to a secondary light source 30b with the outside diameter and the inside diameter both increased, without change in its width (half of the difference between the outside diameter and the inside diameter: as indicated by arrows in the drawing) as shown in FIG. 3 (b). In other words, the annular ratio (inside diameter/outside diameter) and the size (outside diameter) both vary without change in the width of the annular secondary light source, by the operation of the conical axicon system 6.

Figure 4:
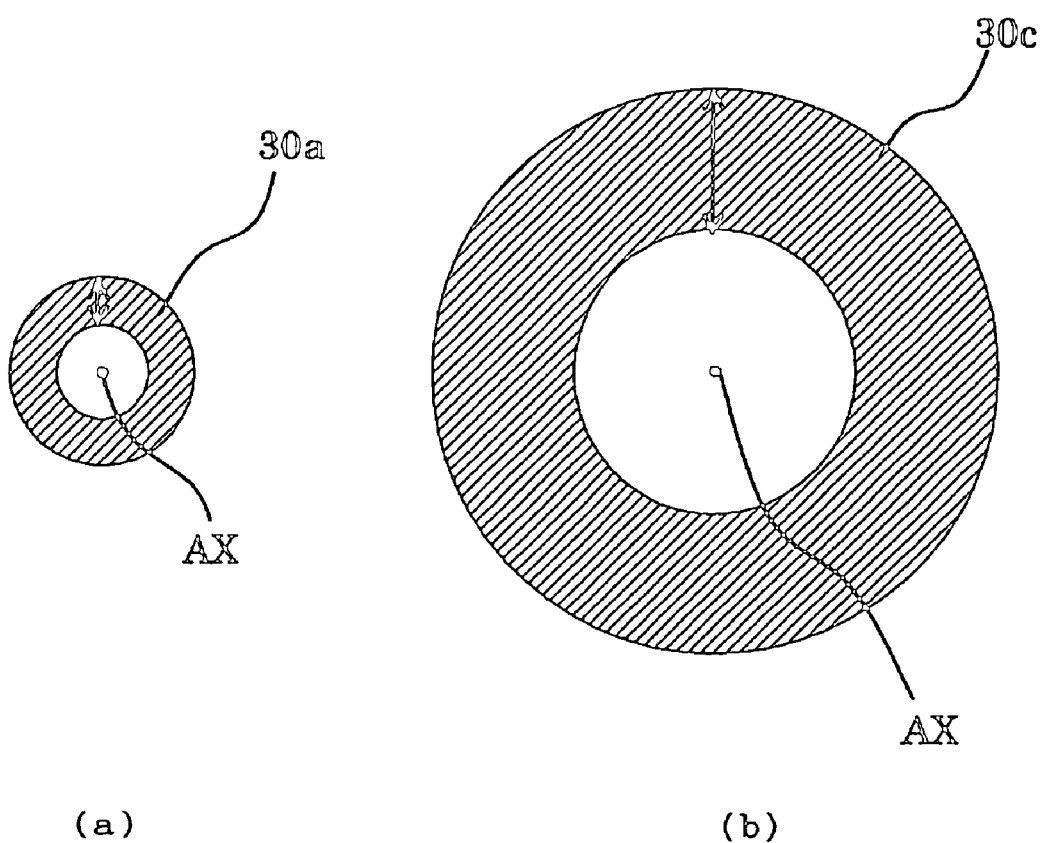
FIG. 4 is a drawing for explaining the operation of a zoom lens on a secondary light source of an annular shape.

FIGS. 4 (a) and (b) is a drawing for explaining the operation of the zoom lens on the secondary light source of annular shape. With reference to FIG. 4 (a), the secondary light source 30a of annular shape is formed in the standard state, and when the focal length of the zoom lens 7 is increased from the minimum to a predetermined value, the secondary light source 30a is changed to a secondary light source 30c of annular shape with the overall shape similarly enlarged as shown in FIG. 4 (b). In other words, the width and size (outside diameter) of the annular secondary light source both vary without change in the annular ratio thereof, by the operation of the zoom lens 7.

As described above, the afocal lens (relay optical system) 4, the conical axicon system 6, and the zoom lens (magnification-varying optical system) 7 constitute a shaping optical system disposed in the optical path between the diffractive optical element 3 and the micro fly's eye lens (optical integrator) 8 and adapted for changing the size and shape of the secondary light source (substantial surface illuminant) formed on the illumination pupil plane.

When a diffractive optical element for quadrupole illumination (not shown) is set in the illumination light path, instead of the diffractive optical element 3 for annular illumination, it can effect quadrupole illumination. The diffractive optical element for quadrupole illumination has the following function: when a parallel light beam having a rectangular cross section is incident thereto, it forms a light intensity distribution of quadrupole shape in its far field. Therefore, light beams having passed through the diffractive optical element for quadrupole illumination form an illumination field of quadrupole shape consisting of four circular illumination fields around the optical axis AX, for example, on the entrance surface of the micro fly's eye lens 8. As a result, a secondary light source of the same quadrupole shape as the illumination field formed on the entrance surface is also formed on or near the rear focal plane of the micro fly's eye lens 8.

When a diffractive optical element for circular illumination (not shown) is set in the illumination light path, instead of the diffractive optical element 3 for annular illumination, it can effect normal circular illumination. The diffractive optical element for circular illumination has the following function: when a parallel light beam having a rectangular cross section is incident thereto, it forms a light intensity distribution of circular shape in its far field. Therefore, a light beam having passed through the diffractive optical element for circular illumination forms an illumination field of circular shape centered on the optical axis AX, for example, on the entrance surface of the micro fly's eye lens 8. As a result, the secondary light source of the same circular shape as the illumination field formed on the entrance surface is also formed on or near the rear focal plane of the micro fly's eye lens 8.

Furthermore, when another diffractive optical element for multi-pole illumination (not shown) is set in the illumination light path, instead of the diffractive optical element 3 for annular illumination, it is feasible to accomplish one of various multi-pole illuminations (dipole illumination, octupole illumination, etc.). Similarly, when a diffractive optical element with an appropriate characteristic (not shown) is set in the illumination light path, instead of the diffractive optical element 3 for annular illumination, it becomes feasible to accomplish one of off-axis or modified illuminations of various forms.

In the conventional technology, as described above, the zero-order light (unwanted light) arising from the diffractive optical element 3, for example, because of manufacture error or the like is focused in the central region of the entrance surface of the micro fly's eye lens 8 (portion near the optical axis AX) to form the surface illuminant in the relatively small size but with the high luminance in the center of the annular secondary light source, thereby failing to achieve desired annular illumination. In the present embodiment, therefore, a diffusion region 6aa for substantially scattering incident light is provided in the central region of the concave conical refracting surface of the first prism member 6a in the conical axicon system 6, as shown in FIG. 5 (a).

Since the conical axicon system 6 is disposed at or near the pupil position of the afocal lens 4 as described above, the diffusion region 6aa on the first prism member 6a is located at a position substantially in the relation of Fourier transform with the diffractive optical element 3. Therefore, the zero-order light arising from the diffractive optical element 3 is focused approximately at a point by the front unit 4a of the afocal lens 4 to impinge on the diffusion region 6aa on the first prism member 6a. The zero-order light impinging on the diffusion region 6aa is subject to the scattering operation thereof to be guided to the outside of the illumination light path.

In this way, the diffusion region 6aa formed in the central region of the concave conical refracting surface of the first prism member 6a is disposed at or near the pupil position of the afocal lens 4 (generally, at a position substantially in the relation of Fourier transform with the diffractive optical element 3 in the optical path of the shaping optical system (4, 6, 7)), and constitutes a preventing device for preventing the zero-order light from the diffractive optical element 3 from traveling along the illumination light path. As a result, the zero-order light arising from the diffractive optical element 3 is blocked by the scattering operation of the diffusion region 6aa as the preventing device and desired annular illumination is accomplished without forming a surface illuminant with a high luminance in the center of the annular secondary light source.

Figure 6:
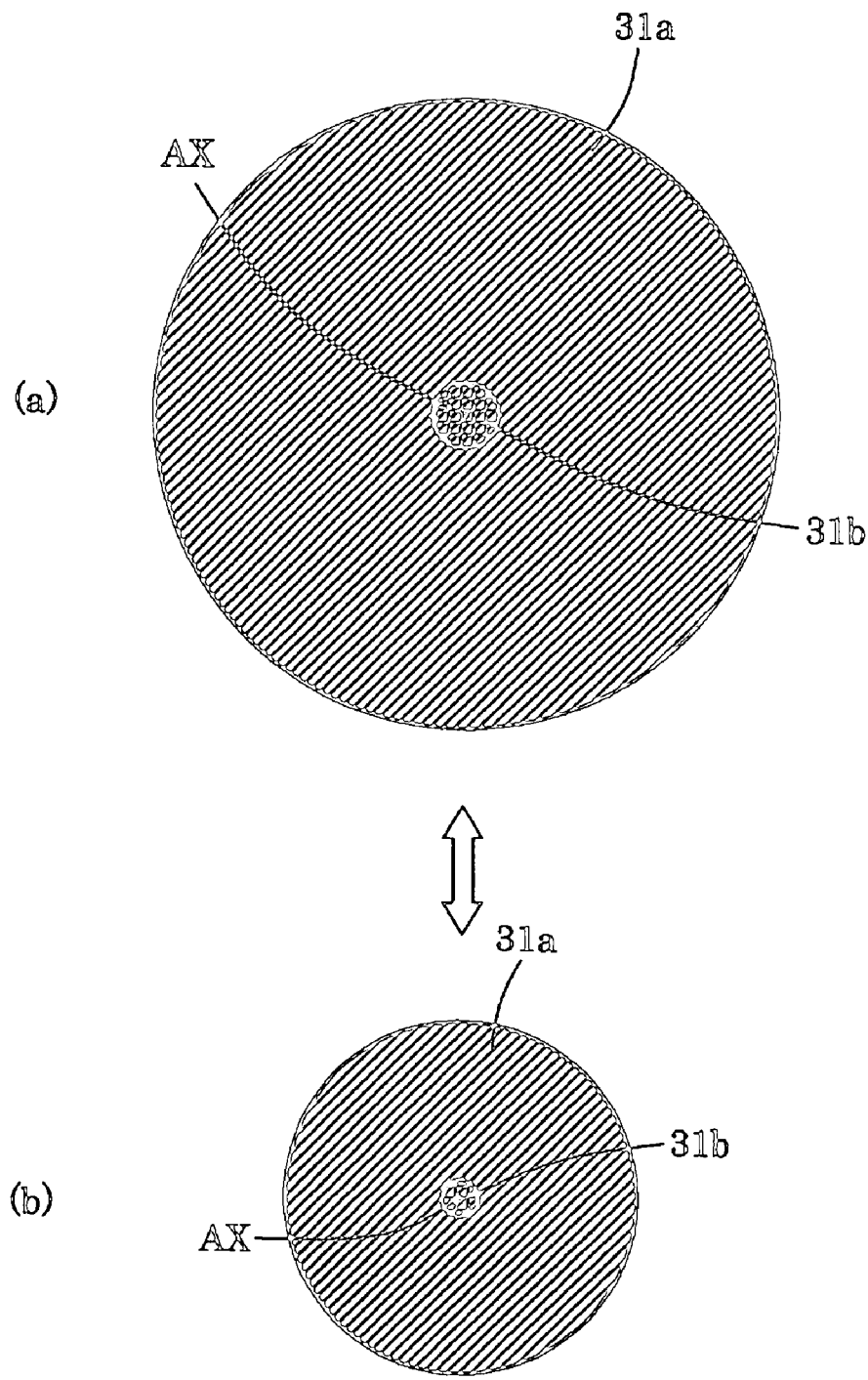
FIG. 6 is a drawing schematically showing a secondary light source formed in circular illumination in the embodiment.

On the other hand, in circular illumination accomplished while the refracting surface of the first prism member 6a is kept in contact with the refracting surface of the second prism member 6b, a small shadow part 31b, as shown in FIGS. 6 (a) and (b), with a light intensity substantially lower than that in the region around it is formed in the central region of the secondary light source 31a of circular shape (portion near the optical axis AX) because of influence of the diffusion region 6aa formed in the central region of the concave conical refracting surface of the first prism member 6a. The overall shape of the circular secondary light source 31a including the shadow part 31b in the central region is similarly reduced or enlarged by operation of the zoom lens 7.

Consequently, the ratio of the outside diameter of the circular secondary light source 31a to the outside diameter of the shadow part 31b is constant both in large-σ circular illumination of FIG. 6 (a) using a relatively large secondary light source of circular shape and in small-σ circular illumination of FIG. 6 (b) using a relatively small secondary light source of circular shape. In other words, the influence of the shadow part 31b on the circular secondary light source 31a is constant, independent of variation in the σ-value in the circular illumination. As a result, almost desired circular illumination with an arbitrary σ-value can be accomplished with little influence of the diffusion region 6aa formed in the central region of the concave conical refracting surface of the first prism member 6a.

In this manner, the illumination optical apparatus (1-11) of the present embodiment is able to accomplish desired annular illumination, almost desired circular illumination with an arbitrary σ-value, and so on, without substantial influence of the zero-order light from the diffractive optical element 3. Accordingly, the exposure apparatus (1-PL) of the present embodiment is able to perform good exposure under an appropriate illumination condition realized according to a pattern characteristic of mask M, because it uses the illumination optical apparatus (1-11) achieving the desired annular illumination and circular illumination without substantial influence of the zero-order light from the diffractive optical element 3.

In passing, if the zero-order light from the diffractive optical element 3 is blocked in the optical path behind the micro fly's eye lens 8 (on the mask side thereof), uniformity will become more likely to degrade in the illuminance distribution on the mask M (and thus on the wafer W) as a surface to be illuminated. Similarly, if the zero-order light from the diffractive optical element 3 is blocked near the entrance surface of the micro fly's eye lens 8, uniformity will also become more likely to degrade in the illuminance distribution on the surface to be illuminated.

In the above-described embodiment the diffusion region 6aa as the preventing device is provided in the central region of the concave circular refracting surface of the first prism member 6a in the conical axicon system 6. However, without having to be limited to it, it is also possible, as shown in FIG. 5 (b), to locate a diffusion region 6ba for substantially scattering incident light, in the central region of the convex conical refracting surface of the second prism member 6b (portion near the optical axis AX) in the conical axicon system 6. However, a preferred configuration to minimize the size of the diffusion region 6aa, so as to minimize the size of the shadow part 31b in the circular secondary light source 31a, is one wherein the diffusion region 6aa is placed on the first prism member 6a, the first prism member 6a is fixed along the optical path AX, and the second prism member 6b is moved along the optical axis AX. In other words, the optical member located in the optical path between the preventing device and the diffractive optical element 3 is preferably fixed in order to minimize the size of the shadow part 31b.

In the foregoing embodiment the diffusion region 6aa for substantially scattering the zero-order light incident thereto is used as the preventing device for preventing the zero-order light from the diffractive optical element 3 from traveling along the illumination light path. However, without having to be limited to it, it is also possible to use a shield region for substantially blocking the zero-order light incident thereto, as the preventing device. In this case, a potential configuration is such that a shield region consisting of a light-shielding thin film, e.g., chromium film is formed in the central region of the concave conical refracting surface of the first prism member 6a (or in the central region of the convex conical refracting surface of the second prism member 6b).

In this connection, if the central parts of the refracting surfaces of the prisms 6a and 6b are processed in a planar shape perpendicular to the optical axis AX, as shown in FIGS. 5 (a) and (b), it will become easier to fabricate the prism members 6a and 6b and also to form the diffusion region or the shield region in the central region processed in the planar shape. It is a matter of course that the effect of the present invention is also achieved well where the diffusion region or the shield region is formed in the central region processed, for example, in a shape corresponding to a side face of a conical body, instead of the planar shape in which the central regions of the refracting surfaces of the prism members 6a and 6b are processed.

In the foregoing embodiment the diffusion region 6aa as the preventing device is provide on the first prism member 6a forming the conical axicon system 6. However, without having to be limited to it, for example in configurations without the conical axicon system, it is also possible, as shown in FIG. 7 (a), to adopt a modification example wherein a diffusion region (or shield region) 12a as a preventing device is provided in a central region of a plane-parallel plate 12 (portion near the optical axis AX) located at or near the pupil position of the afocal lens 4 (at a position substantially in the relation of Fourier transform with the diffractive optical element 3).

Similarly, as shown in FIG. 7 (b), it is also possible to adopt a modification example wherein a relatively small diffusion member (or shield member) 13 centered on the optical axis AX is provided at or near the pupil position of the afocal lens 4 (at a position substantially in the relation of Fourier transform with the diffractive optical element 3). In this case, a preferred configuration is such that the diffusion member (or shield member) 13 is stably supported by means of a plurality of rod members 13a (three members in FIG. 7) as thin as possible, so as not to substantially block passage of required rays contributing to illumination.

In the illumination optical apparatus of the foregoing embodiment, the preventing device that prevents the zero-order light from the diffractive optical element from traveling along the illumination light path is disposed at a position substantially in the relation of Fourier transform with the diffractive optical element, in the optical path of the shaping optical system for changing the size and shape of the substantial surface illuminant formed on the illumination pupil plane of the illumination optical apparatus. As a result, desired annular illumination and circular illumination is implemented without substantial influence of the zero-order light from the diffractive optical element, by the operation of the preventing device.

In the foregoing embodiment the preventing device is provided on the first prism member 6a forming the conical axicon system 6. However, without having to be limited to it, plural types of preventing devices different in the size of the shield region (or the diffusion region) may be arranged as replaceable, for example as shown in FIG. 8, at a position near the entrance surface of the micro fly's eye lens 8.

Figure 8:
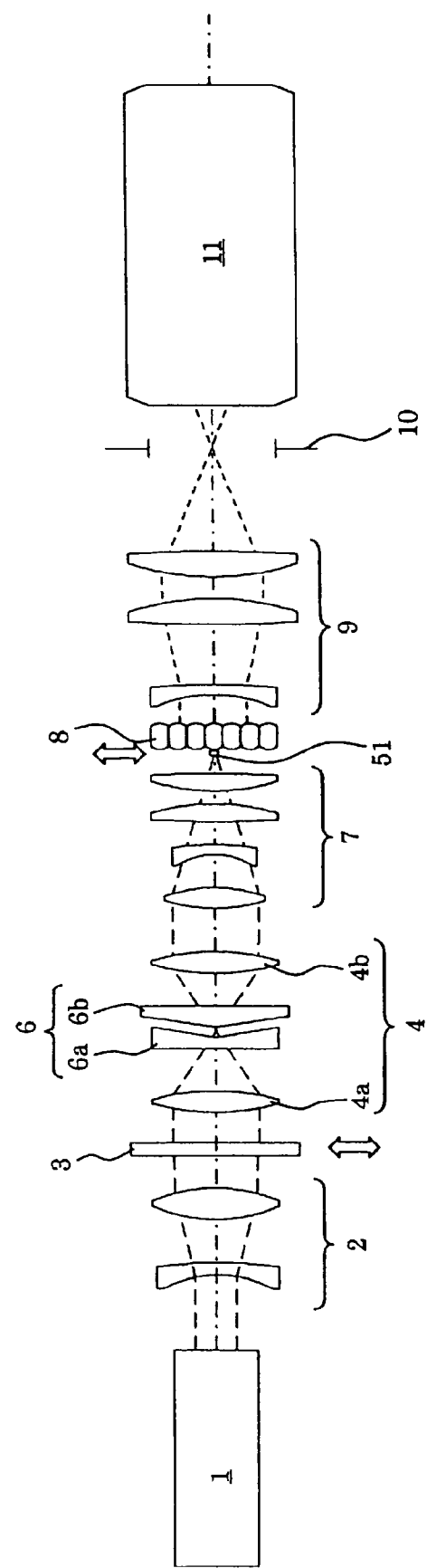
FIG. 8 is a drawing schematically showing a configuration of a modification example in which plural types of preventing devices are arranged as replaceable.

FIG. 8 is a drawing schematically showing a configuration of a modification example wherein plural types of preventing devices are arranged as replaceable, in which members with equivalent functionality are denoted by the same reference symbols as in FIG. 1. For simplifying the description, the below will describe only a different configuration from the embodiment shown in FIG. 1.

Figure 9:
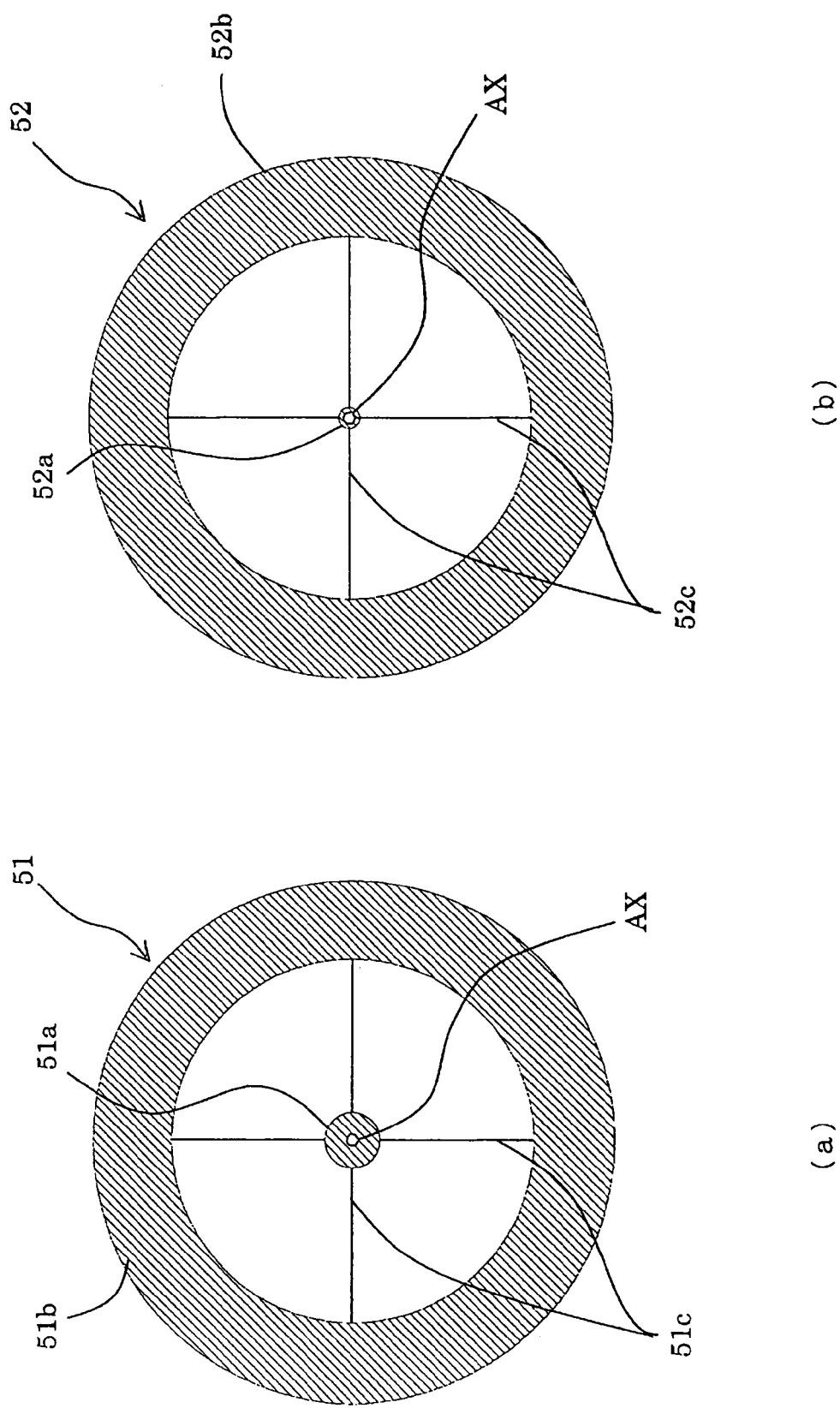
FIG. 9 is a drawing schematically showing configurations of shield members as the preventing devices in FIG. 8.

In FIG. 8, a first shield member 51 as a preventing device is disposed at a position near the entrance surface of the micro fly's eye lens 8 (which is a position substantially in the relation of Fourier transform with the diffractive optical element 3, where the zero-order light from the diffractive optical element 3 is focused). As shown in FIGS. 9 (a) and (b), this first shield member 51 is composed of a shield region 51a, an outer frame 51b, and rod members 51c supporting the shield region 51a, and is arranged to be replaceable with a second shield member 52 having a shield region 52a of a different size.

In the modification example shown in FIGS. 8 and 9, the first shield member 51 shown in FIG. 9 (a) is positioned in the illumination light path in order to accomplish large-σ illumination using a relatively large, circular, secondary light source, and the second shield member 52 shown in FIG. 9 (b) is positioned in the illumination light path in order to accomplish small-σ illumination using a relatively small, circular, secondary light source. In consequence, this configuration limits the region where the shield region 52a shields the second light source, to an extremely small area even in the case of small σ-illumination using the relatively small, circular, secondary light source, whereby almost predetermined circular illumination with an arbitrary σ-value can be accomplished with little influence of the shield region 52a.

Figure 10:
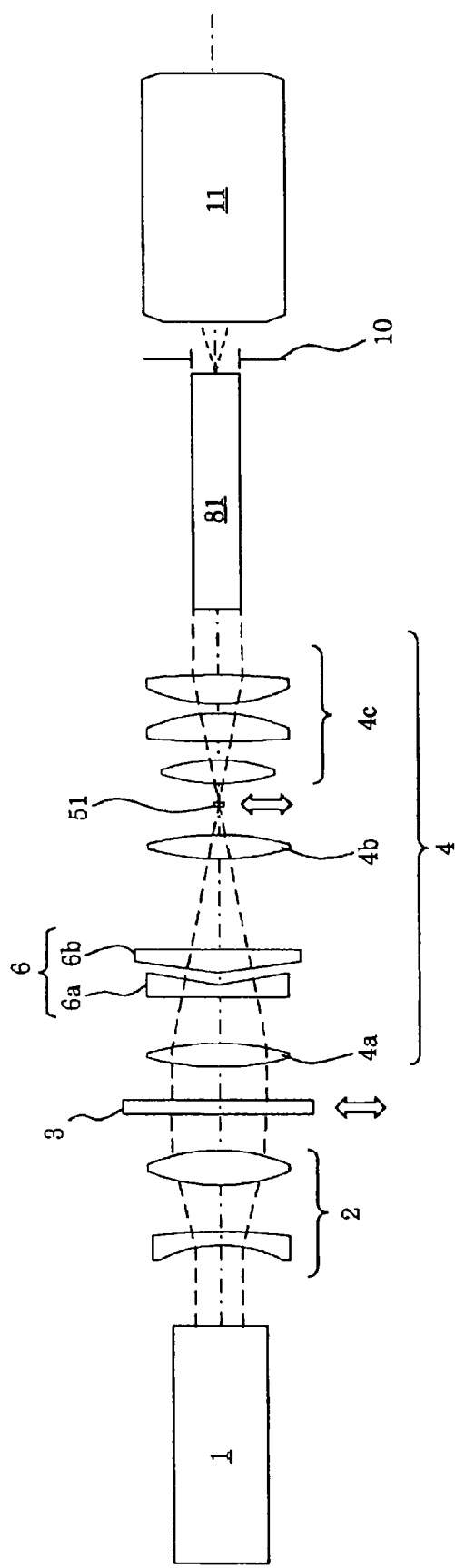
FIG. 10 is a drawing schematically showing a configuration of a modification example using an internal reflection type rod integrator as an optical integrator.

In the foregoing embodiment and modification examples, the micro fly's eye lens 8 was used as an optical integrator for uniformizing the illuminance on the surface to be illuminated, but, without having to be limited to it, an internal reflection type rod integrator 81 may be used as an optical integrator, for example, as shown in FIG. 10.

FIG. 10 is a drawing schematically showing a configuration of a modification example where the rod integrator of the internal reflection type is used as an optical integrator, in which members with similar functionality are denoted by the same reference symbols as in the examples of FIGS. 1 and 8. For simplifying the description, the below will describe only a different configuration from the examples of FIGS. 1 and 8.

In FIG. 10, the afocal lens 4 is disposed in the optical path between the diffractive optical element 3 and the rod integrator 81. In the modification example of FIG. 10, the afocal lens 4 is composed of a front unit having lenses (or lens units) 4a, 4b, and a rear unit having a lens unit 4c. In this connection, the rear focal position of the lenses (lens units) 4a, 4b agrees approximately with the front focal position of the lens unit 4c, and the lenses (lens units) 4a, 4b, 4c as a whole constitute an afocal optical system. The conical axicon system 6 having the first prism member 6a and the second prism member 6b is disposed in the optical path between the lenses (lens units) 4a, 4b.

Here the function of changing the size while keeping the width of the annular secondary light source constant by change of the distance between the prism members 6a, 6b of the conical axicon system 6 is much the same as in the foregoing embodiment. In the modification example of FIG. 10, while the rear focal position of the lenses (lens units) 4a, 4b is kept approximately constant, the focal length thereof is changed by movement of the lenses (lens units) 4a, 4b in the optical-axis direction. The combination of the internal reflection type rod integrator 81 with the condenser lens unit 4c shown in FIG. 10 corresponds to the combination of the micro fly's eye lens 8 with the condenser optical system 9 in the aforementioned embodiment. The combination of the internal reflection type rod integrator with the axicon system is disclosed in U.S. Pat. No. 6,285,443. The teachings of U.S. Pat. No. 6,285,443 are incorporated by reference.

In the modification example of FIG. 10, as in the modification example of FIG. 8, the first shield member 51 as the preventing device is also disposed near the rear focal position of the lenses (lens units) 4a, 4b (which is a position substantially in the relation of Fourier transform with the diffractive optical element 3, where the zero-order light from the diffractive optical element 3 is focused). This first shield member 51 is arranged as replaceable with the second shield member 52 having the shield region 52a of the different size. Thanks to this configuration, the modification example of FIG. 10 also limits the region where the shield region 52a shields the secondary light source, to an extremely small area even in the case of small-σ illumination using the relatively small, circular, secondary light source, and is thus able to accomplish almost predetermined circular illumination with an arbitrary σ-value, with little influence of the shield region 52a.

The modification examples shown in FIGS. 8-10 used the shield members 51, 52 as the preventing devices, but, without having to be limited to them, diffusion members each having a diffusion region may also be used as the preventing devices.

The exposure apparatus of the foregoing embodiment can be used to manufacture micro devices (semiconductor devices, image pickup devices, liquid-crystal display devices, thin-film magnetic heads, etc.) by illuminating a mask (reticle) by the illumination optical apparatus (illumination block) and projecting a pattern to be transferred, formed in the mask, onto a photosensitive substrate with the projection optical system (exposure block). An example of a technique of forming a predetermined circuit pattern in a wafer or the like as a photosensitive substrate with the exposure apparatus of the foregoing embodiment to obtain semiconductor devices as micro devices will be described below with reference to the flowchart of FIG. 11.

Figure 11:
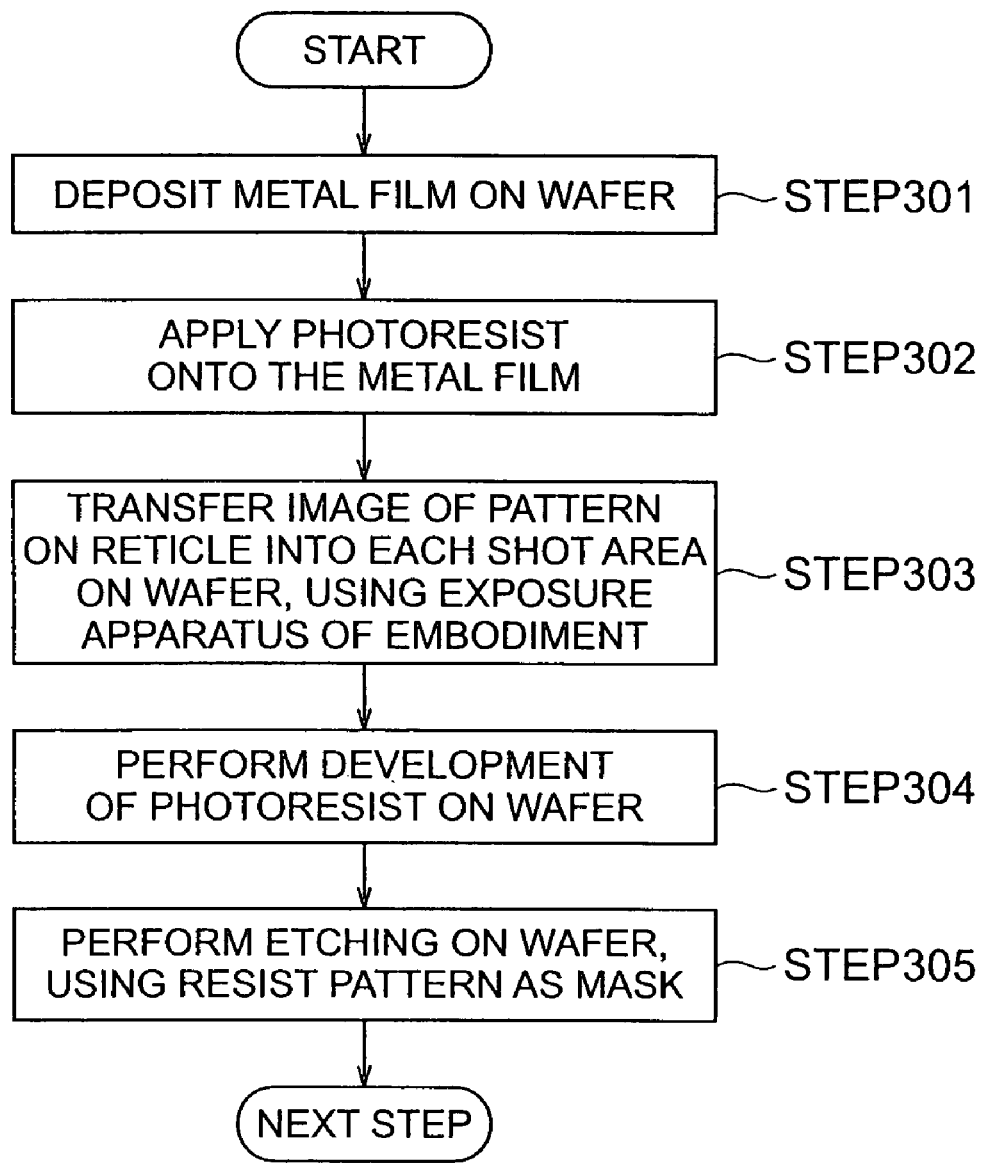
FIG. 11 is a flowchart of a technique of manufacturing semiconductor devices as micro devices.

The first block 301 in FIG. 11 is to deposit a metal film on each wafer in one lot. The next block 302 is to apply a photoresist onto the metal film on each wafer in the lot. The subsequent block 303 is to sequentially transfer an image of a pattern on the mask into each shot area on each wafer in the lot through the projection optical system, using the exposure apparatus of the foregoing embodiment. The subsequent block 304 is to perform development of the photoresist on each wafer in the lot and the subsequent block 305 is to perform etching on each wafer in the lot, using the resist pattern as a mask, and thereby to form a circuit pattern corresponding to the pattern on the mask, in each shot area on each wafer. Subsequent blocks include formation of circuit patterns in upper layers, and others, thereby manufacturing devices such as semiconductor devices. The above-described semiconductor device manufacturing method permits us to obtain semiconductor devices with extremely fine circuit patterns at high throughput.

Figure 12:
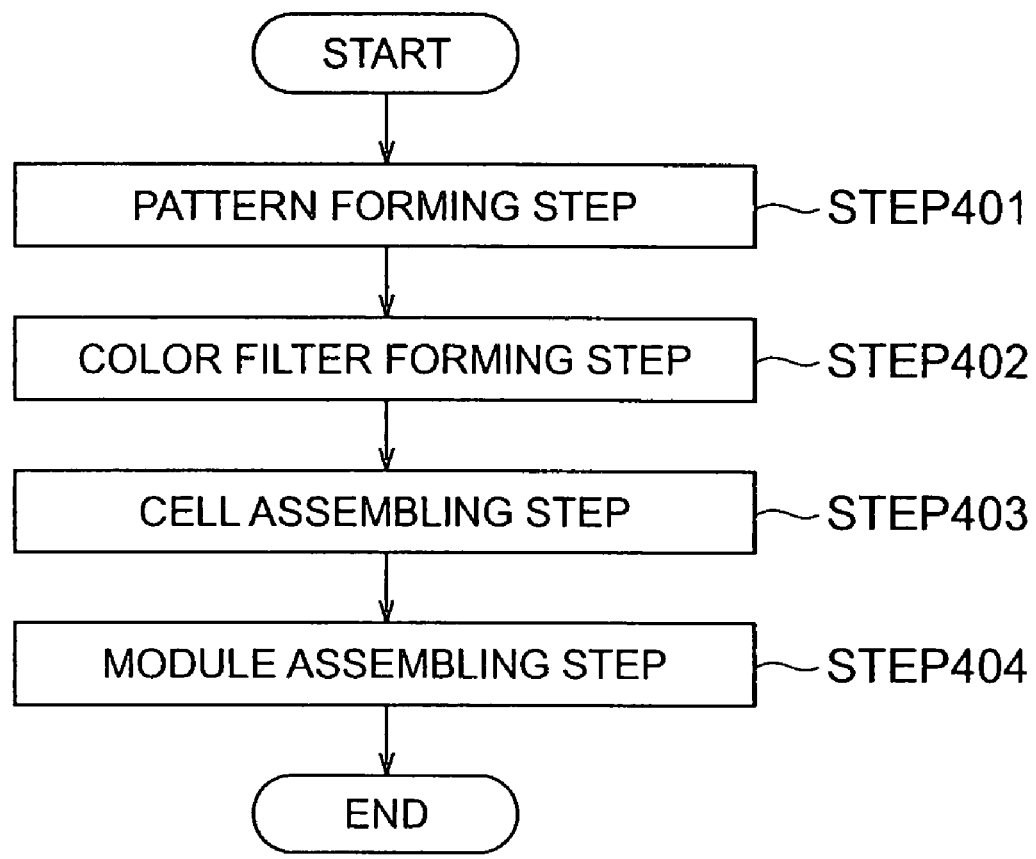
FIG. 12 is a flowchart of a technique of manufacturing a liquid-crystal display element as a micro device.

The exposure apparatus of the foregoing embodiment can also be used to manufacture a liquid-crystal display device as a micro device by forming predetermined patterns (circuit pattern, electrode pattern, etc.) on plates (glass substrates). An example of a technique in this case will be described with reference to the flowchart of FIG. 12. In FIG. 12, a pattern forming block 401 is to execute a so-called photolithography block to transfer a pattern of a mask onto a photosensitive substrate (glass substrate coated with a resist, or the like) with the exposure apparatus of the foregoing embodiment. This photolithography block results in forming the predetermined pattern including a number of electrodes and others on the photosensitive substrate. Thereafter, the exposed substrate is subjected to each of blocks such as development, etching, and resist removal, whereby a predetermined pattern is formed on the substrate. Thereafter, the process shifts to the next color filter forming block 402.

The next color filter forming block 402 is to form a color filter in which a number of sets of three dots corresponding to R (Red), G (Green), and B (Blue) are arrayed in a matrix pattern, or in which sets of three stripe filters of R, G, and B are arrayed as a plurality of lines along the horizontal scan line direction. After completion of the color filter forming block 402, a cell assembling block 403 is carried out. The cell assembling block 403 is to assemble a liquid crystal panel (liquid crystal cell), using the substrate with the predetermined pattern obtained in the pattern forming block 401, the color filter obtained in the color filter forming block 402, and so on.

In the cell assembling block 403, for example, a liquid crystal is poured into between the substrate with the predetermined pattern obtained in the pattern forming block 401 and the color filter obtained in the color filter forming block 402, to manufacture a liquid crystal panel (liquid crystal cell). The subsequent module assembling block 404 is to install each of components such as an electric circuit, a backlight, etc. for display operation of the assembled liquid crystal panel (liquid crystal cell) to complete the liquid-crystal display device. The above-described method of manufacturing the liquid-crystal display device permits us to obtain the liquid-crystal display device with an extremely fine circuit pattern at high throughput.

Since the exposure apparatus and exposure method of the foregoing embodiment use the illumination optical apparatus implementing the desired annular illumination and circular illumination without substantial influence of the zero-order light from the diffractive optical element, they are able to perform good exposure under an appropriate illumination condition realized according to a pattern characteristic of the mask and are thus able to manufacture good devices at high throughput.

In the foregoing embodiment, the exposure light was the ArF excimer laser light (wavelength: 193 nm), but, without having to be limited to it, the present invention is also applicable to other appropriate laser light sources, e.g., a KrF excimer laser light source for supplying light having the wavelength of 248 nm and an $F_2$ laser light source for supplying a laser beam having the wavelength of 157 nm. Furthermore, the foregoing embodiment described the application of the present invention to the illumination optical apparatus for illuminating the mask in the exposure apparatus, but, without having to be limited to it, the present invention is also applicable to ordinary illumination optical apparatus for illuminating other surfaces to be illuminated, except for the mask with the light beam from the light source.

In the foregoing embodiment, it is also possible to adopt a technique of filling the optical path between the projection optical system and the photosensitive substrate with a medium having the refractive index of more than 1.1 (typically, a liquid), i.e., the so-called liquid immersion method. In this case, the technique of filling the liquid in the optical path between the projection optical system and the photosensitive substrate can be one selected from the method of locally filling the space with the liquid as disclosed in International Publication WO99/49504, the method of moving a stage holding a substrate as an exposed object, in a liquid bath as disclosed in Japanese Patent Application Laid-open No. 6-124873, the method of forming a liquid bath of a predetermined depth on a stage and holding a substrate in the liquid bath as disclosed in Japanese Patent Application Laid-open No. 10-303114, and so on. The teaching of International Publication WO99/49504, and Japanese Patent Application Laid-Open Nos. 6-124873, and 10-303114 are incorporated by reference.

The liquid is preferably one that is transparent to the exposure light, that has the refractive index as high as possible, and that is stable against the projection optical system and the photoresist laid on the surface of the substrate; for example, where the KrF excimer laser light or the ArF excimer laser light is used as the exposure light, the liquid can be pure water or deionized water. Where the exposure light is the $F_2$ laser light, the liquid can be a fluorine-based liquid, for example, such as fluorine oil or perfluoro polyether (PFPE) capable of transmitting the $F_2$ laser light.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

The invention claimed is:

1. An illumination optical apparatus that illuminates a surface to be illuminated, with a light beam from a light source, the illumination optical apparatus comprising:
    a diffractive optical element disposed in an optical path between the light source and the surface to be illuminated;
    an optical integrator disposed in an optical path between the diffractive optical element and the surface to be illuminated; and
    a beam damper disposed at a position in the optical path between the diffractive optical element and the optical integrator, where zero-order light from the diffractive optical element is focused,
    wherein an optical element disposed in an optical path between the diffractive optical element and the beam damper is fixed, and
    wherein an optical system disposed in an optical path between the beam damper and the optical integrator includes a movable optical element.

2. The illumination optical apparatus according to claim 1, further comprising a shaping optical system which is disposed in an optical path between the diffractive optical element and the optical integrator and which is configured to change a size and shape of a substantial surface illuminant.

3. The illumination optical apparatus according to claim 2, wherein the shaping optical system includes a relay optical system, and a magnification-varying optical system disposed in an optical path between the relay optical system and the optical integrator.

4. The illumination optical apparatus according to claim 3, wherein the beam damper is disposed in an optical path of the relay optical system.

5. The illumination optical apparatus according to claim 4, wherein the relay optical system comprises:
    a first prism including a refracting surface of a concave cross section; and
    a second prism including a refracting surface of a convex cross section substantially complementary to the refracting surface of the concave cross section of the first prism,
    wherein the first prism and the second prism are disposed in the optical path of the relay optical system and wherein a distance between the first prism and the second prism is variable.

6. The illumination optical apparatus according to claim 5, wherein the beam damper is set on a vertex of the first prism.

7. The illumination optical apparatus according to claim 1, wherein the beam damper includes a diffusion region that scatters the zero-order light incident thereto.

8. The illumination optical apparatus according to claim 1, wherein the beam damper includes a shield region that blocks the zero-order light incident thereto.

9. An exposure apparatus comprising the illumination optical apparatus as defined in claim 1, that illuminating a pattern, the exposure apparatus exposes the pattern on a photosensitive substrate.

10. An exposure method comprising:
illuminating a pattern by using the illumination optical apparatus as defined in claim 1; and
exposing the pattern on a photosensitive substrate.

11. A device manufacturing method comprising:
illuminating a pattern by using the illumination optical apparatus as defined in claim 1;
exposing the pattern on a photosensitive substrate; and
developing the photosensitive substrate.

12. An illumination optical apparatus that illuminates a surface to be illuminated, with a light beam from a light source, the illumination optical apparatus comprising:
a diffractive optical element disposed in an optical path between the light source and the surface to be illuminated;
an optical integrator disposed in an optical path between the diffractive optical element and the surface to be illuminated;
a first beam damper which is disposed at a position in the optical path between the diffractive optical element and the optical integrator, where zero-order light from the diffractive optical element is focused, and which includes a first damp area; and
a second beam damper which is interchangeable with the first beam damper, and which includes a second damp area which differs from the first damp area in size.

13. The illumination optical apparatus according to claim 12, further comprising a shaping optical system which is disposed in an optical path between the diffractive optical element and the optical integrator and which is adapted for changing a size and shape of a substantial surface illuminant.

14. The illumination optical apparatus according to claim 13, wherein the shaping optical system includes a relay optical system, and a magnification-varying optical system disposed in an optical path between the relay optical system and the optical integrator.

15. The illumination optical apparatus according to claim 13, wherein the first and second beam dampers are arrangeable in an optical path between the shaping optical system and the optical integrator.

16. The illumination optical apparatus according to claim 12, wherein the beam damper includes a diffusion region that scatters the zero-order light incident thereto.

17. The illumination optical apparatus according to claim 12, wherein the beam damper includes a shield region that blocks the zero-order light incident thereto.

18. An exposure apparatus comprising the illumination optical apparatus as defined in claim 12, that illuminating a pattern, the exposure apparatus exposes the pattern on a photosensitive substrate.

19. An exposure method comprising:
illuminating a pattern by using the illumination optical apparatus as defined in claim 12; and
exposing the pattern on a photosensitive substrate.

20. A device manufacturing method comprising:
illuminating a pattern by using the illumination optical apparatus as defined in claim 12;
exposing the pattern on a photosensitive substrate; and
developing the photosensitive substrate.

21. An illumination optical apparatus that illuminates a surface to be illuminated, with a light beam from a light source, the illumination optical apparatus comprising:
a diffractive optical element, arranged in an optical path between the light source and the surface to be illuminated, which converts the light beam from the light source into a light beam with a predetermined light intensity distribution;
an optical integrator disposed in an optical path between the diffractive optical element and the surface to be illuminated;
a shaping optical system disposed in an optical path between the diffractive optical element and the optical integrator and configured to change a size and shape of a substantial surface illuminant; and
preventing device disposed at a position in the optical path between the diffractive optical element and the optical integrator, where zero-order light from the diffractive optical element is focused, and configured to prevent the zero-order light from the diffractive optical element from traveling along an illumination light path;
wherein the preventing device restrains influence of the zero-order light on the substantial surface illuminant even when the shaping optical system changes the size of the substantial surface illuminant.

22. The illumination optical apparatus according to claim 21, wherein the preventing device is disposed in an optical path of the shaping optical system.

23. The illumination optical apparatus according to claim 22, wherein the shaping optical system includes a relay optical system, and a magnification-varying optical system disposed in an optical path between the relay optical system and the optical integrator.

24. The illumination optical apparatus according to claim 23, wherein the preventing device is disposed in the optical path of the relay optical system.

25. The illumination optical apparatus according to claim 24, wherein an optical member disposed in an optical path between the preventing device and the diffractive optical element is fixed.

26. The illumination optical apparatus according to claim 21, wherein the preventing device includes a diffusion region that scatters the zero-order light incident thereto.

27. The illumination optical apparatus according to claim 26, further comprising:
a first prism including a refracting surface of a concave cross section; and
a second prism including a refracting surface of a convex cross section substantially complementary to the refracting surface of the concave cross section of the first prism,
wherein the first prism and the second prism are disposed in an optical path of the relay optical system and wherein a distance between the first prism and the second prism is variable, and
wherein at least one of the first prism and the second prism is provided with the diffusion region.

28. The illumination optical apparatus according to claim 27, wherein the refracting surface includes a shape corresponding to a side face of a conical body centered on an optical axis of the illumination optical apparatus.

29. The illumination optical apparatus according to claim 21, wherein the preventing device includes a shield region that blocks the zero-order light incident thereto.

30. The illumination optical apparatus according to claim 29, further comprising:
   a first prism including a refracting surface of a concave cross section; and
   a second prism including a refracting surface of a convex cross section substantially complementary to the refracting surface of the concave cross section of the first prism, wherein the first prism and the second prism are disposed in an optical path of the relay optical system, and
   wherein a distance between the first prism and the second prism is variable, and
   wherein at least one of the first prism and the second prism is provided with the shield region.

31. The illumination optical apparatus according to claim 30, wherein the refracting surface includes a shape corresponding to a side face of a conical body centered on an optical axis of the illumination optical apparatus.

32. An exposure apparatus comprising the illumination optical apparatus as defined in claim 21, that illuminating a pattern, the exposure apparatus exposes the pattern on a photosensitive substrate.

33. An exposure method comprising:
   illuminating a pattern by using the illumination optical apparatus as defined in claim 21; and
   exposing the pattern on a photosensitive substrate.

34. A device manufacturing method comprising:
   illuminating a pattern by using the illumination optical apparatus as defined in claim 21;
   exposing the pattern on a photosensitive substrate; and
   developing the photosensitive substrate.

35. An illumination optical apparatus that illuminates a surface to be illuminated, with a light beam from a light source, the illumination optical apparatus comprising:
   a diffractive optical element, arranged in an optical path between the light source and the surface to be illuminated, which converts the light beam from the light source into a light beam with a predetermined light intensity distribution;
   an optical integrator disposed in an optical path between the diffractive optical element and the surface to be illuminated;
   a shaping optical system disposed in an optical path between the diffractive optical element and the optical integrator and adapted for changing a size and shape of the substantial surface illuminant; and
   preventing device disposed at a position where zero-order light from the diffractive optical element is focused, in an optical path of the shaping optical system, and configured to prevent the zero-order light from the diffractive optical element from traveling along an illumination light path.

36. The illumination optical apparatus according to claim 35, wherein the shaping optical system has a relay optical system, and a magnification-varying optical system disposed in an optical path between the relay optical system and the optical integrator.

37. The illumination optical apparatus according to claim 36, wherein the preventing device is disposed at or near a pupil position of the relay optical system.

38. The illumination optical apparatus according to claim 37, wherein an optical member disposed in an optical path between the preventing device and the diffractive optical element is fixed.

39. The illumination optical apparatus according to claim 38 wherein the preventing device restrains influence thereof on a substantial surface illuminant even when the shaping optical system changes the size of the substantial surface illuminant.

40. The illumination optical apparatus according to claim 35, wherein the preventing device includes a diffusion region that scatters the zero-order light incident thereto.

41. The illumination optical apparatus according to claim 40, further comprising:
   a first prism including a refracting surface of a concave cross section; and
   a second prism including a refracting surface of a convex cross section substantially complementary to the refracting surface of the concave cross section of the first prism, wherein the first prism and the second prism are disposed in an optical path of the relay optical system and wherein a distance between the first prism and the second prism is variable, and
   wherein at least one of the first prism and the second prism is provided with the diffusion region.

42. The illumination optical apparatus according to claim 41, wherein the refracting surface includes a shape corresponding to a side face of a conical body centered on an optical axis of the illumination optical apparatus.

43. The illumination optical apparatus according to claim 35, wherein the preventing device includes a shield region that blocks the zero-order light incident thereto.

44. The illumination optical apparatus according to claim 43, further comprising:
   a first prism including a refracting surface of a concave cross section; and
   a second prism including a refracting surface of a convex cross section substantially complementary to the refracting surface of the concave cross section of the first prism, wherein the first prism and the second prism are disposed in an optical path of the relay optical system and wherein a distance between the first prism and the second prism is variable, and
   wherein at least one of the first prism and the second prism is provided with the shield region.

45. The illumination optical apparatus according to claim 44, wherein the refracting surface includes a shape corresponding to a side face of a conical body centered on an optical axis of the illumination optical apparatus.

46. An exposure apparatus comprising the illumination optical apparatus as defined in claim 35, that illuminates a pattern, the exposure apparatus exposes of the pattern on a photosensitive substrate.

47. An exposure method comprising:
   illuminating a pattern by using the illumination optical apparatus as defined in claim 35; and
   exposing the pattern on a photosensitive substrate.

48. A device manufacturing method comprising:
   illuminating a pattern by using the illumination optical apparatus as defined in claim 35;
   exposing of the pattern on a photosensitive substrate; and
   developing the photosensitive substrate.

* * * * *